(12) United States Patent
Yamasaki et al.

(10) Patent No.: US 6,715,413 B2
(45) Date of Patent: Apr. 6, 2004

(54) APPARATUS AND METHOD OF SCREEN PRINTING

(75) Inventors: Kimiyuki Yamasaki, Fukuoka (JP); Michinori Tomomatsu, Fukuoka (JP); Seikoh Abe, Fukuoka (JP); Seiichi Miyahara, Fukuoka (JP); Yuji Otake, Fukuoka (JP); Takahiro Fukagawa, Fukuoka (JP); Kunihiko Tokita, Fukuoka (JP); Masayuki Mantani, Fukuoka (JP); Minoru Murakami, Fukuoka (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/851,585

(22) Filed: May 9, 2001

(65) Prior Publication Data
US 2002/0007743 A1 Jan. 24, 2002

(30) Foreign Application Priority Data

| May 9, 2000 | (JP) | 2000-135696 |
| May 9, 2000 | (JP) | 2000-135697 |
| May 9, 2000 | (JP) | 2000-135699 |

(51) Int. Cl.⁷ ............................................. B41F 15/46
(52) U.S. Cl. ........................ 101/123; 101/129; 118/713
(58) Field of Search ................... 101/123, 126, 101/129, 484; 118/406, 713

(56) References Cited

U.S. PATENT DOCUMENTS

| 4,864,361 A | 9/1989 | Amao et al. | 355/53 |
| 5,280,436 A | 1/1994 | Kubota et al. | 364/559 |
| 5,459,941 A | 10/1995 | Lowe | 33/620 |
| 5,479,854 A | * 1/1996 | Chikahisa et al. | 101/123 |
| 5,740,729 A | * 4/1998 | Hikita et al. | 101/126 |
| 5,812,693 A | * 9/1998 | Burt et al. | 382/149 |
| 6,140,827 A | * 10/2000 | Wark | 324/758 |

FOREIGN PATENT DOCUMENTS

| GB | 2 353 759 A | 3/2001 |
| JP | 6-238867 | * 8/1994 |
| JP | 2000-275028 | 10/2000 |
| WO | WO 97/48258 | 12/1997 |

* cited by examiner

Primary Examiner—Ren Yan
(74) Attorney, Agent, or Firm—Rossi & Associates

(57) ABSTRACT

A screen-printing apparatus for printing creamy solder paste on a substrate by attaching a screen mask to the substrate. A laser-measuring device mounted in the apparatus measures the top surface of the screen mask at a printing position and the top of the substrate at a substrate-measurement position by three-dimensional measurement, and detects a shape of the substrate or the screen mask, and determines whether or not they are acceptable. After screen printing is completed, the substrate and the screen mask undergo a printing inspection where their shapes are inspected. This provides not only inspection data of the printing results but also data for identifying the causes of print failures. As a result, the screen-printing apparatus, which has high-printing accuracy and can prevent printing failures from occurring, is provided.

8 Claims, 11 Drawing Sheets

APPARATUS AND METHOD OF SCREEN PRINTING

FIELD OF THE INVENTION

The present invention relates to an apparatus and a method of screen printing, which is a way of printing paste, e.g. creamy solder paste and conductive paste, on a substrate.

BACKGROUND OF THE INVENTION

Screen-printing method has been used for printing paste, e.g., creamy solder paste, on a substrate. This method includes the following steps:
(a) Attaching a screen mask, which has pattern openings formed therein corresponding to positions to be printed on the substrate, onto the substrate; and
(b) Supplying creamy solder paste onto the mask and sliding squeegees. Solder paste is printed on the substrate through the pattern openings.

After the above steps finish, printing inspection for inspecting the state of creamy solder paste printed on the substrate is performed. A screen-printing apparatus equipped with print-checking capability is widely known that printing inspection is performed in the apparatus. Conventionally, such an apparatus with inspecting capability takes an image of the substrate by a camera mounted for recognizing a printed substrate, performs the image processing and determines whether or not the creamy solder paste is printed precisely on a position to be printed.

In this kind of screen printing, to ensure good-quality printing requires to set proper printing conditions responsive to each object to be printed. Various parameters, e.g. the velocity at which squeegees are slid on the mask in screen printing, the printing pressure at which the squeegees are pressed against the mask and a substrate-detaching velocity relative to the mask. These various parameters are predetermined responsive to features of each object. This operation of setting these conditions has been adjusted by skilled labor having extensive experience.

This kind of screen printing apparatuses include moving mechanisms performing predetermined movements for each printing operation, e.g. a substrate-positioning section for holding and positioning the substrate or a mechanism for raising and lowering the substrate toward or away from relatively to the mask. A control mechanism being capable of controlling positions with numeric data, e.g. servomechanism, is used in these moving mechanisms. To ensure good positioning accuracy in the control mechanism requires a teaching operation in order to preset a parameter indicating the position of the origin in a control program responsive to an origin of a mechanical-coordinate system in an actual apparatus. Generally, the teaching operation has been manually performed by a skilled person using various measuring instruments when he or she activates the apparatus or carries out a regular maintenance.

The forgoing conventional screen-printing apparatus has problem as described below.

First, a conventional printing inspection has used a method of determining on the basis of two-dimensional image data taken by the camera mounted in the apparatus. Therefore, when an inspection item can be determined by only two-dimensional data, e.g. printing position, plane shape, high-quality results are obtained. However, when an inspection item needs three-dimensional data for pass/fail determination, e.g. the amount of printing, height of printing, highly-accurate inspection by the conventional method has been impossible. Additionally, after screen printing is completed, the printed substrate is conventionally inspected by camera, and only the printing results for pass/fail determination are obtained. However, data enough to identify the causes of print failure cannot be obtained. To address the problem of print failure has been difficult due to data shortages.

Second, a number of skilled labor has declined year and year. To gather skilled labor for setting printing conditions has been difficult. Moreover, a manufacturing system shifts to a flexible manufacturing system, i.e., limited production of a variety products. Every time a kind of product is changed, printing conditions has to be changed. Therefore, an immatured-skilled person is obliged to set the printing condition. As a result, the printing conditions are varied depending on the difference of the experiences. Consequently, in the conventional screen printing, to keep stable-high-quality printing has been difficult due to variation of printing conditions.

Third, machine adjusting operation or teaching operation in the conventional manner needs adjustment operation such as measurement of relative position in each section of the machine. Therefore, the operation becomes complicated and teaching operation has taken time and labor. A method that can carry out adjustment of mechanisms and teaching operations with ease and accuracy has been required.

SUMMARY OF THE INVENTION

The present invention addresses the problems discussed above, and aims to provide an apparatus and a method of screen printing having various advantages as shown below.
(a) The apparatus can carry out printing inspection with high accuracy by three-dimensional measuring means.
(b) The apparatus can provide data to identify the cause of the print failure, consequently, it prevents the print failure from occurring.
(c) The apparatus can set printing conditions with ease and without disperses of the printing conditions, and this allows good quality of printing.
(d) The apparatus can carry out adjustment of mechanisms and teaching operations with ease and high accuracy.

The apparatus of the present invention prints a pattern with pastes on a substrate via pattern openings by attaching a screen mask onto the substrate and sliding a squeegee head on the screen mask. The apparatus includes the following elements.
(a) A substrate-positioning means for precisely positioning the substrate relatively to the screen mask having pattern openings;
(b) A three-dimensionally-measuring means for three-dimensionally measuring the top surface of the screen mask at a position to be printed and a top of the substrate at a position to be measured;
(c) A transfer means for moving the three-dimensionally measuring means; and
(d) An inspecting means for inspecting at least one of the substrate or the screen mask based on results measured by the three-dimensional measuring means.

The method of screen printing of the present invention includes the following steps.
(a) Substrate-positioning process for positioning the substrate relative to the screen mask;
(b) Three-dimensional measuring process for measuring three-dimensionally the top surface of the screen mask at a position to be printed and the top surface of the substrate at a substrate-measuring position; and (c) Inspection process for inspecting at least one of the substrate or the screen mask by an inspecting means based on the measuring result by the three-dimensional measuring means.

This configuration or this method allows the substrate and the screen mask to be inspected before and after screen printing, and the causes of the failures to be identified with ease.

Another screen-printing apparatus of the present invention includes the following elements.

(a) A substrate-positioning means for positioning the substrate relative to the screen mark having pattern openings;

(b) A three-dimensional measuring means for measuring screen mask from the above at a printing position and the substrate at the substrate-measuring positioning position;

(c) A moving means for moving the three-dimensional measuring means;

(d) A printing-condition-setting means for setting screen-printing condition based on measuring results by the three dimensional measuring; and (e) A printing-condition storing means;

Another method of screen printing of the present invention includes the following steps.

(a) After printing measurement-process for measuring at least one of the screen mask at printing position and the substrate at the substrate measuring position from the above;

(b) A printing-conditions-setting process for setting screen-printing condition; and (c) A storing process for storing the printing condition set in a print-condition-storing means.

According to this configuration or this method, the substrate and the screen mask after screen printing are measured from the above by the three-dimensional measuring means and by setting conditions of screen printing based on the measuring results. This allows disperses in setting conditions of printing to be eliminated and stable good printing quality to be ensured.

Further another screen-printing apparatus of the present invention includes the following elements;

(a) A substrate-positioning means for positioning the substrate relative to the screen mask having pattern openings;

(b) A three-dimensional measuring means for measuring an object in the range including a mounting section of the screen mask and a substrate positioning means;

(c) A moving means for moving the three-dimensional measuring means; and (d) An origin-setting means for determining an origin position in the control program by identifying a position of a given measuring point set on an object to be measured with respect to a mechanical-coordinates-origin of the screen printing apparatus, based on a measuring result by the three dimensional measuring means.

Further another method of screen printing includes the following steps:

(a) Measuring three-dimensionally a predetermined point on the mechanism of the screen-printing apparatus by the three-dimensional measuring means having a measuring range including a screen-mask-mounting section and the substrate-positioning means for positioning the substrate with respective to the screen mask;

(b) Determining a position of predetermined measuring point set on an object with respect to a mechanical coordinate origin of the screen printing apparatus based on the three-dimensional measuring.

(c) Setting an origin of the control program.

This configuration or this method allows the apparatus to be carried out operations of adjusting mechanisms and teaching with ease and high accuracy.

DETAILED DESCRIPTION OF THE INVENTION

An embodiment of the present invention is demonstrated hereinafter with reference to the accompanying drawings.

Figure 1:
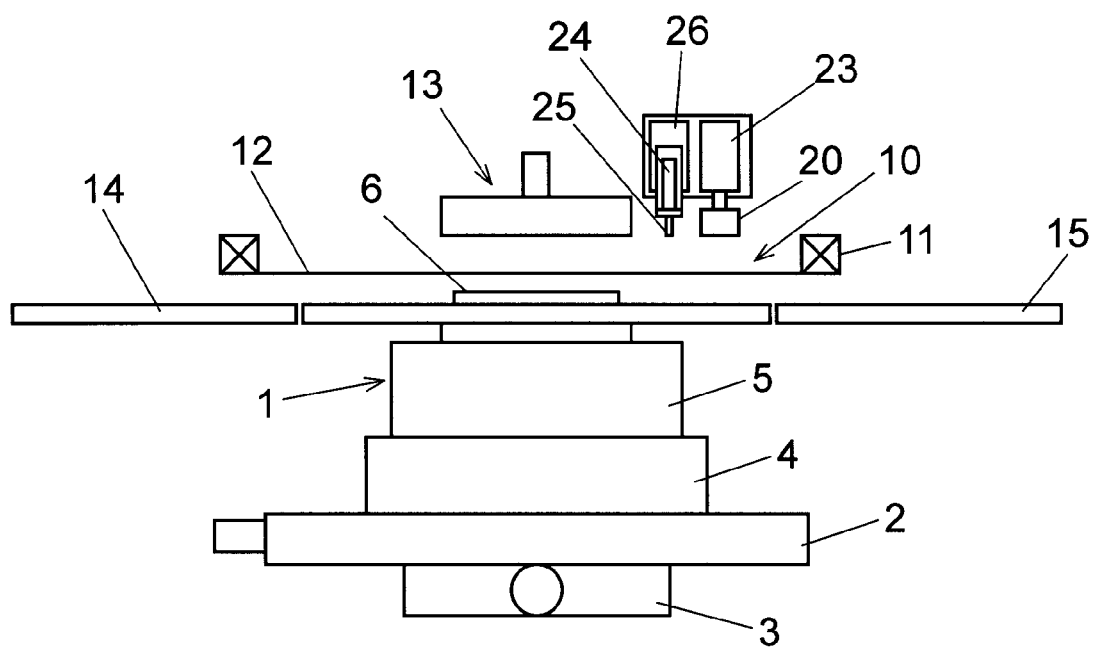
FIG. 1 is a front view of a screen-printing apparatus in accordance with an embodiment of the present invention.
Figure 2:
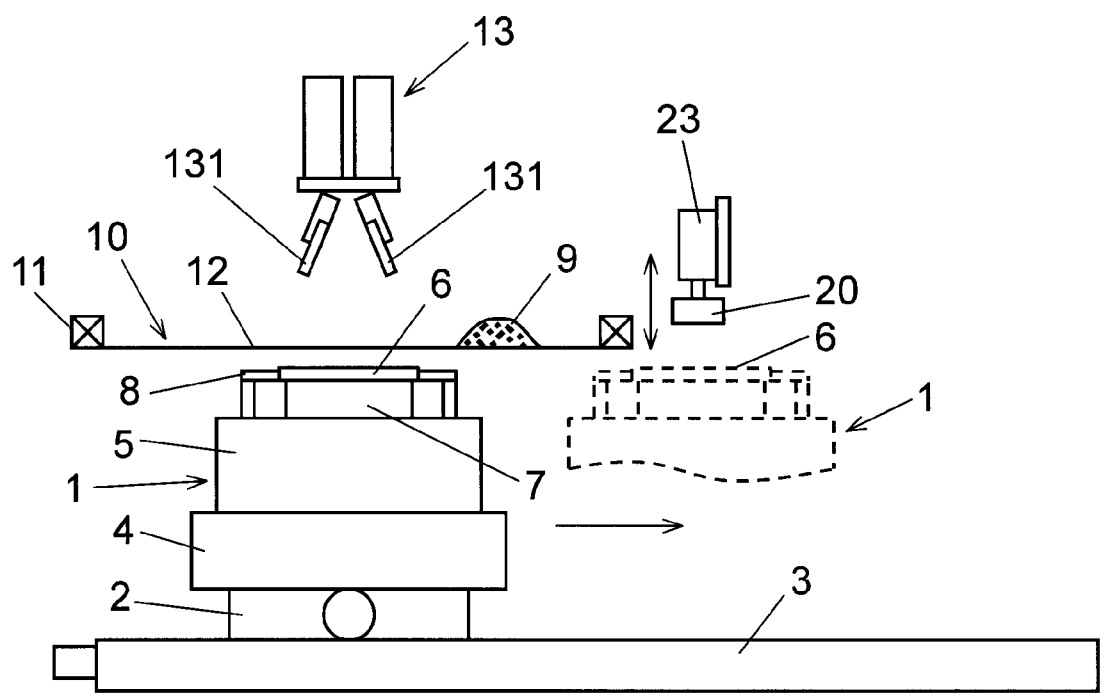
FIG. 2 is a side view of the screen-printing apparatus shown in FIG. 1.
Figure 3:
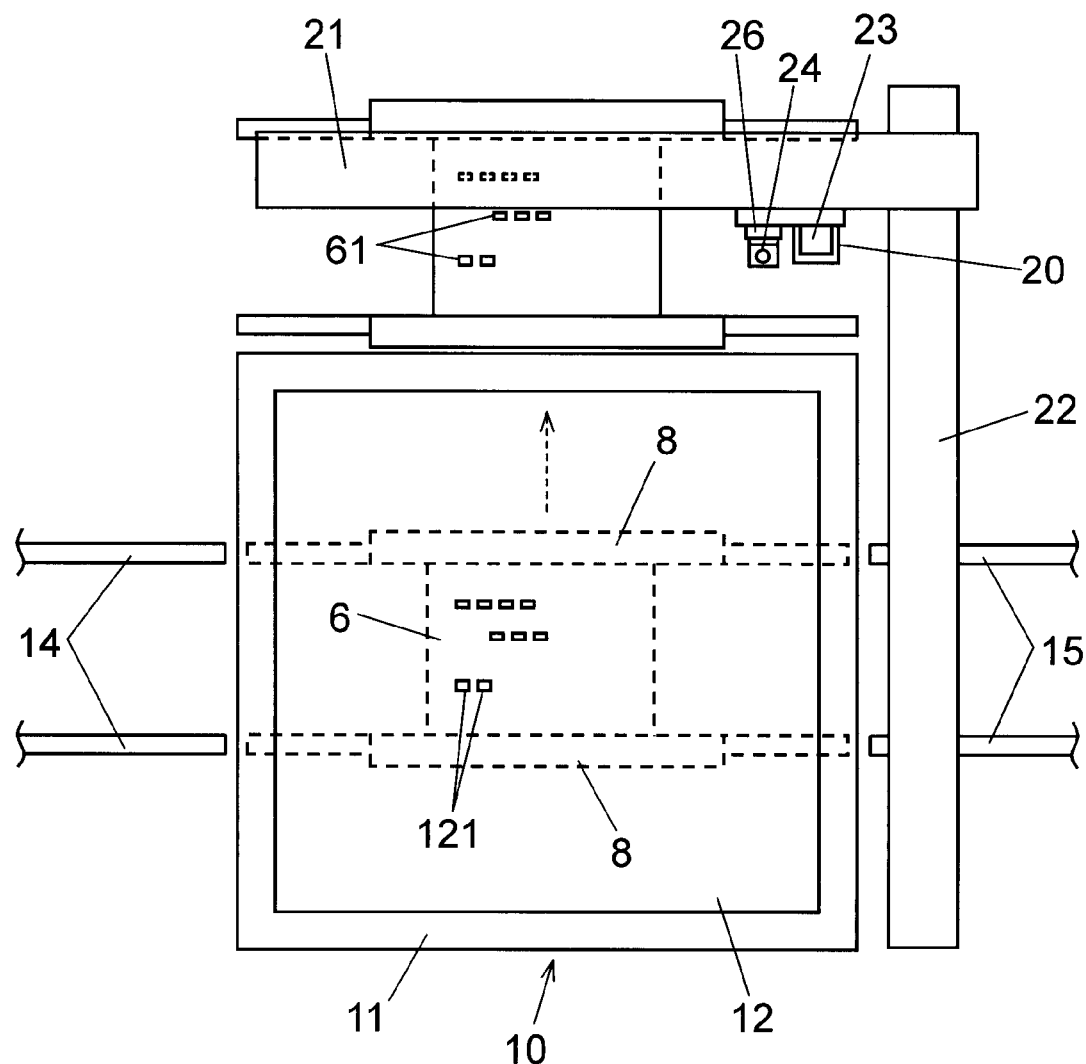
FIG. 3 is a plan view of the screen-printing apparatus shown in FIG. 1.

FIG. 1 is a front view of a screen printing apparatus in the embodiment of the present invention. FIG. 2 is a side view of the same. FIG. 3 is a plan view of the same.

Figure 4:
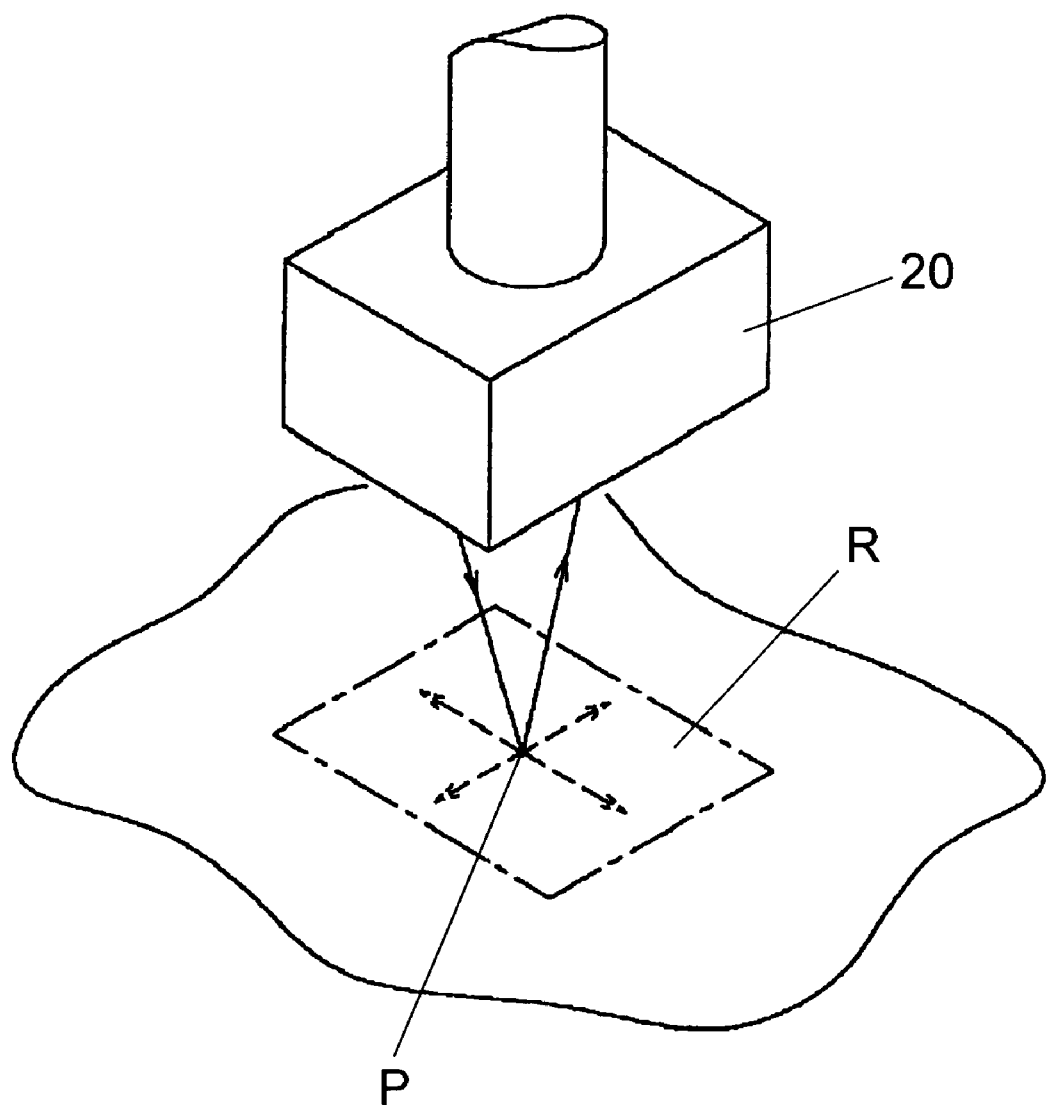
FIG. 4 is a perspective view of a laser-measuring device in the screen-printing apparatus shown in FIG. 1

As shown in FIG. 1 and FIG. 2, substrate-positioning section 1 is a substrate-positioning means and includes X-axis table 2, Y-axis table 3, θ-axis table 4 and Z-axis table 5. θ-axis table 4 is stacked on a moving table formed by X-axis table 2 on Y-axis table 3, and further Z-axis table 5 is placed on top of θ-axis table 4. Substrate-holding section 7 is disposed on table 5. Holding section 7 holds substrate 6 clamped by clamper 8 from underneath. Substrate 6 to be printed runs into positioning-section 1 by run-in conveyor 14 as shown in FIG. 3 and FIG. 4. Substrate 6 is adjusted by driving positioning-section 1. Substrate 6 printed completely is run out by run-out conveyor 15.

Screen mask 10 is placed over positioning-section 1. Mask 10 includes holder 11 and mask plate 12 placed on holder 11. Substrate 6 is positioned to mask plate 12 by positioning-section 1 and attached to mask plate 12 from a lower side.

Squeegee head 13 moving horizontally reciprocally is disposed over mask 10. When substrate 6 is attached on the underneath surface of mask plate 12, creamy solder paste 9 is supplied onto mask plate 12. Then, squeegee 131 of head 13 presses on the surface of mask plate 12 and slides on it. Thus, creamy solder paste 9 is printed on electrode 61 (see FIG. 3) formed on the surface of substrate 6 through pattern opening 121 (see FIG. 3) disposed in mask plate 12.

Laser-measuring device 20—a three-dimensional measuring means—is disposed over mask 10. As shown in FIG. 3, X-axis-table 21 and Y-axis-table 22 allow laser-measuring device 20 to be moved horizontally in the X-Y direction. Raising-and-lowering means 23 allows device 20 to be moved vertically, i.e. X-axis table 21, Y-axis table 22 and raising-and-lowering means 23 are a moving means for moving device 20 vertically and horizontally.

Laser-measuring device 20 includes a capability of measuring the vertical displacement by the laser radiation and a scanning mechanism for scanning a point of the laser radiation in the X-Y direction. FIG. 4 is a perspective view of device 20. As shown in FIG. 4, device 20 detects continuously vertical positions of a surface of an object to be measured by scanning radiating point P within a measuring range R and determines a three-dimensional shape of the object.

When device 20 is moved toward substrate 6 and mask plate 12 by the above moving means, device 20 can measure a three-dimensional shape within any range in substrate 6 and mask plate 12. When the data detected from the above measurement are analyzed, an arrangement of electrodes 61—feature portions on substrate 6—and an arrangement of pattern openings 121—feature portions in screen mask 10—are detected. Furthermore, when the three-dimensional measurement is carried out on substrate 6 after printing on substrate 6 is complete, a three-dimensional shape of creamy solder paste 9 printed on substrate 6 can be detected.

Dispenser 24—a paste-dispensing means—is disposed in X-axis table 21 and Y-axis table 22 which move horizontally device 20. Dispenser 24 includes dispensing nozzle 25 for supplying creamy solder paste 9. Raising-and-lowering mechanism 26 allows dispenser 24 to move vertically.

When print-failure position undergoes touch-up printing, the following steps are taken;

first, move dispenser 24 using both tables 21 and 22 toward a print-failure part and position dispenser directly above the part.

second, lower dispenser 24 to the position.

third, dispense solder paste 9 from nozzle 25.

Figure 7A:
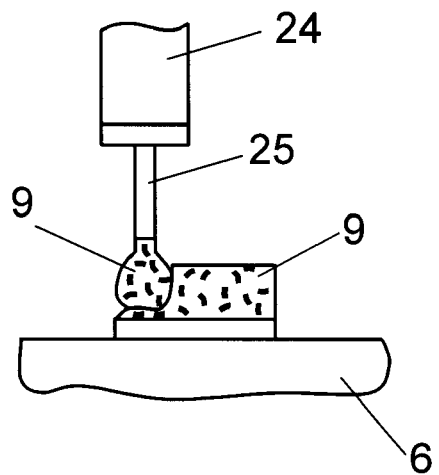
FIG. 7A and FIG. 7B are explanatory diagrams showing how the screen-printing apparatus shown in FIG. 1 carries out touchup printing.
Figure 7B:
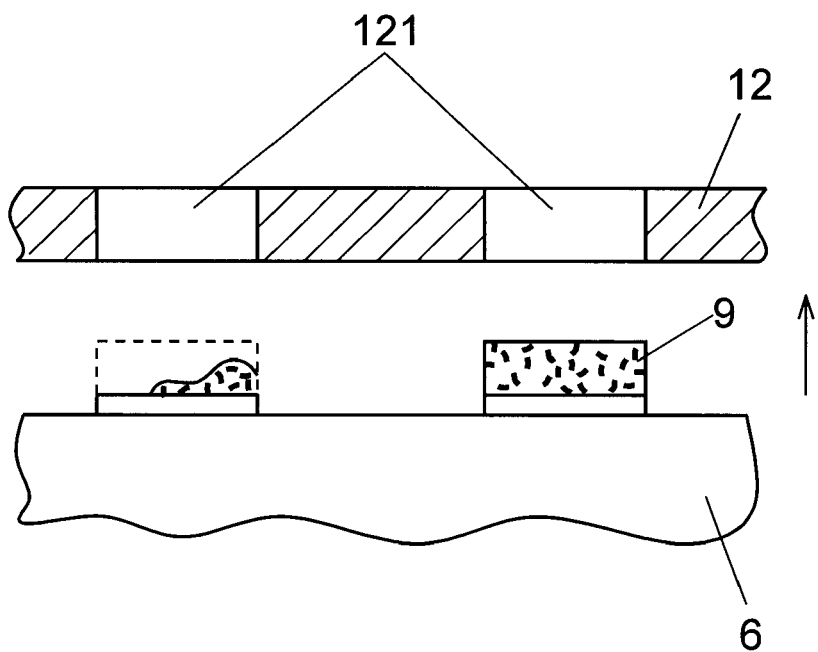

This allows solder paste 9 for touch-up printing to be supplied into the print-failure position, i.e. dispenser 24 is configured to be a touch-up means for touching up print-failure parts. FIGS. 7A and 7B are illustrations of the way to touch up the print-failure part.

Additionally, device 20 carries out three-dimensional measurement on an object within a range of measurement of device 20, i.e. within an operating range of both tables. The object, for example, includes measuring points predetermined on the top of positioning section 1 or on the top of holding frame 101 mounting mask 10. This allows a position of each measuring point relative to the origin of the mechanical coordinates system of the screen-printing apparatus to be determined.

Figure 5:
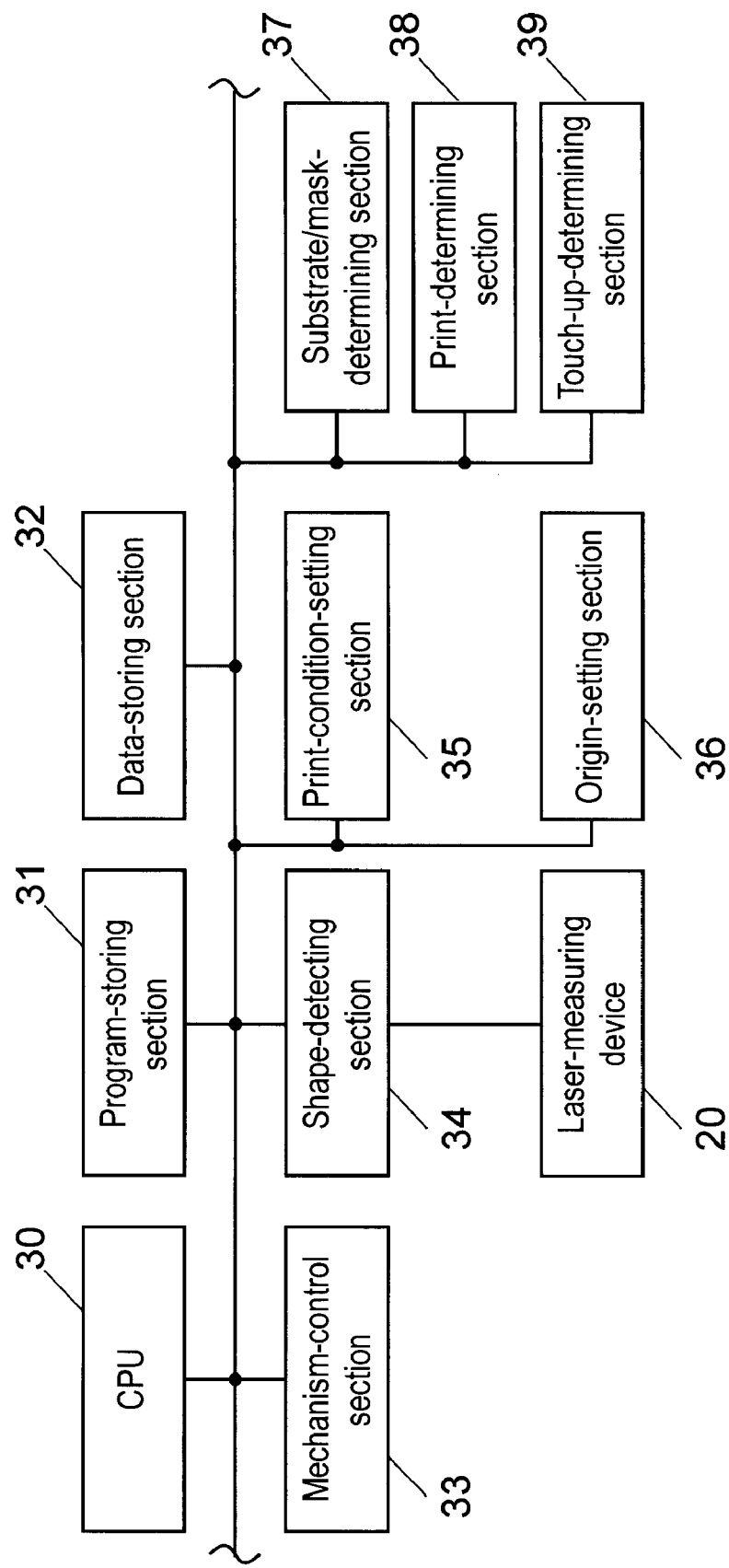
FIG. 5 is a block diagram illustrating configuration of a control system of the screen-printing apparatus shown in FIG. 1.

Then, construction of a control system of the screen-printing apparatus is demonstrated with reference to FIG. 5. As illustrated in FIG. 5, CPU 30 functions as a whole-control section of the apparatus, and controls the entire sections explained below individually. Program-storing section 31 stores various programs, e.g. an operation program of screen printing, a processing program for determining a shape of substrate 6 or mask plate 12 based on signals detected by laser-measuring device 20, a determining program on inspection of print, a program for predetermining print conditions. Data-storing section 32 stores various data., e.g. data of screen-printing conditions, a library of print conditions including data needed to set print conditions and data of print conditions determined by a kind of produce, data of reference values for determining on inspection of printed part for failures, and data of standards and acceptable limits on data for setting an origin described later.

Mechanism-control section 33 controls each mechanism such as positioning section 1, conveyors 14 and 15, X-axis table 21 and Y-axis table 22. Shape detecting section 34 processes signals detected by device 20 to scan. This allows various arrangement patterns and shapes to be detected—, e.g., electrode-arrangement pattern of electrodes 61 arranged on substrate 6, an opening-arrangement pattern of pattern openings 121 disposed in mask plate 12, a shape of creamy solder paste 9 after screen printing is complete, further, a shape of the feature portion such as an opening or an edge by the predetermined measuring point of mechanisms to be three-dimensionally measured.

Substrate/mask determining section 37 compares the arrangement pattern of the electrodes and the openings with the reference pattern of design data stored in storing section 32. Based on the results, determining section 37 determines whether or not substrate 6 or mask plate 12 supplied into the screen-printing apparatus is accepted. In other words, substrate/mask-determining section acts as a supply-material-determining section.

Print-determining section 38 compares data of shapes of solder paste 9 detected on printed substrate 6 by device 20 with reference data stored previously. Based on the comparison results, determining section 38 determines whether a state of print is accepted. A print-failure substrate unaccepted by print-determining section 38 is determined by touch-up-determining section whether the print-failure substrate 38 can be touched up in this apparatus, and select one from two kinds of methods of touching up. In other words, data of shape solder paste 8 determined by the three-dimensional-shape-measurement are compared with data stored in the library of touch-up applications. Based on this results, the substrate is determined whether it can be touched up in the printing apparatus. When the substrate can be touched up in the apparatus, one of the following two kinds of touching up methods is applied for the substrate.

First, when area that is to be touched up is only a part of the whole, touching up by dispenser 24 is performed. When numbers of touch-up areas are available or the failure is very bad, the failure substrate 6 is attached to mask plate 12 again and is reprinted because additional touch up by dispenser 24 would take a lot of time. In this case, printing capability of the screen-printing apparatus acts as a touch-up means for touching up area of print-failure substrate. Thus, to select a suitable method of touching up responsive to a state of print-failure substrate leads to efficient touch-up printing.

In the configuration described above, substrate/mask-determining section 37 and print-determining 38 act as an inspecting means for inspecting substrate 6 and/or screen mask 10 based on the results measured by laser-measuring device 20. Touch-up-print determining section acts as a touch-up means for touching up print-failure parts.

Printing-condition-setting section 35 (a printing-condition-setting means) predetermines various parameters of printing conditions responsive to properties of each object to be printed. The various parameters include a squeegee velocity at which squeegee 131 slides on mask plate 12 during screen printing, a print-pressure with which squeegee 131 presses mask plate 12, a plate-detaching velocity indicating a relative velocity of substrate 6 and mask plate 12 when substrate 6 is detached from mask plate 12.

Next, setting of printing conditions is described.

Figure 8:
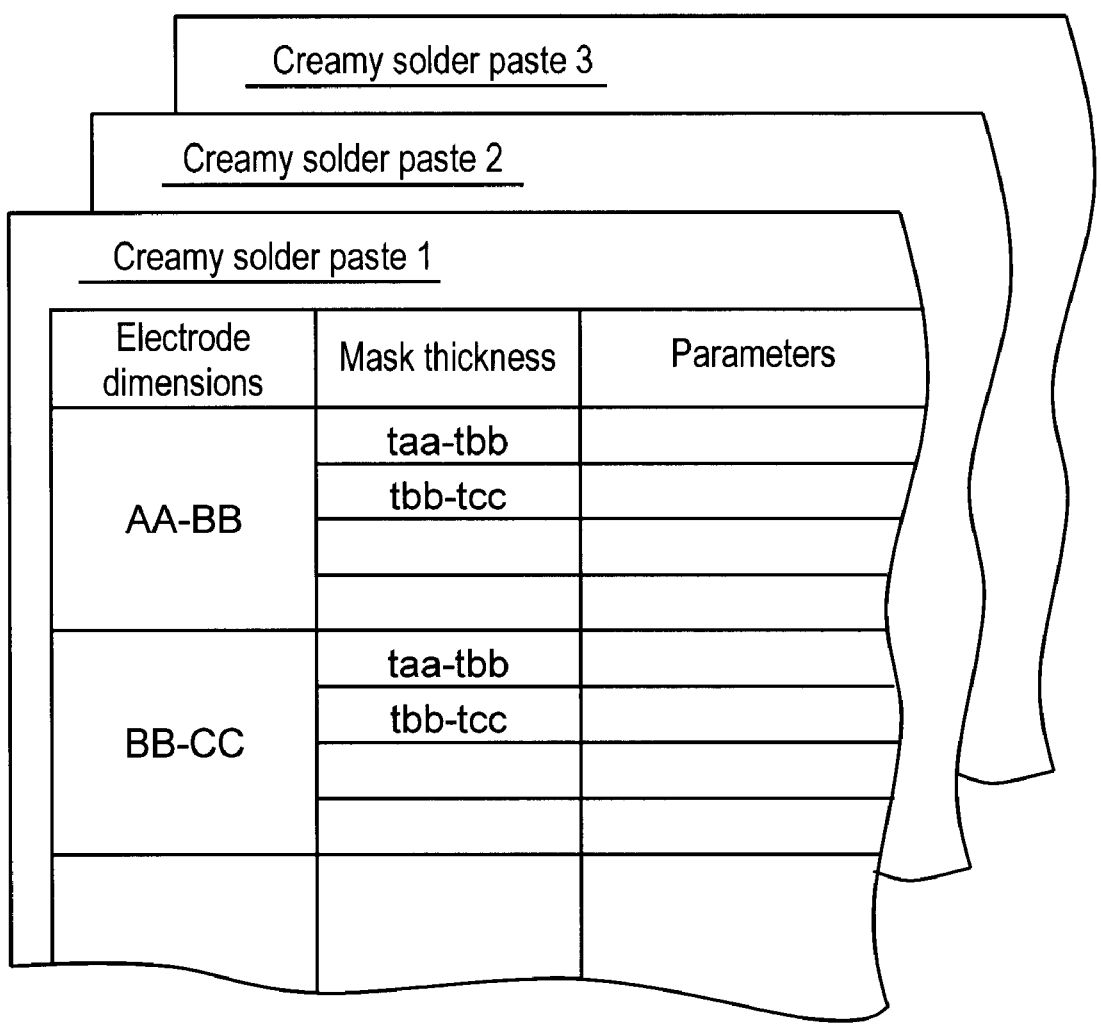
FIG. 8 illustrates data library on screen-printing conditions of the screen-print apparatus.

FIG. 8 illustrates data of the library on printing conditions. In the library, a combination of a typical dimension of the electrode on the substrate (e.g. a width measurement of the electrode) and a typical dimension of the screen mask having pattern openings (e.g. a thickness of the mask plate) is brought into a combination of the above parameters (the above squeegee velocity, printing pressure, substrate-detaching velocity and substrate-detaching distance indicating relative-moving-distance-between mask plate 12 and substance 6). This value of parameter varies with physical properties of creamy solder 9.

As a result, when solder paste, a typical dimension of the electrode on the substrate and a typical dimension of the mask are selected, parameters responsive to the combination are selected and then the parameters are automatically set.

Generally, a printing condition combined each parameter is assigned to each substrate, however, in the special case, two or more combinations of printing-condition parameters are used, and different printing conditions are applied for a specific printing range.

Figure 9:
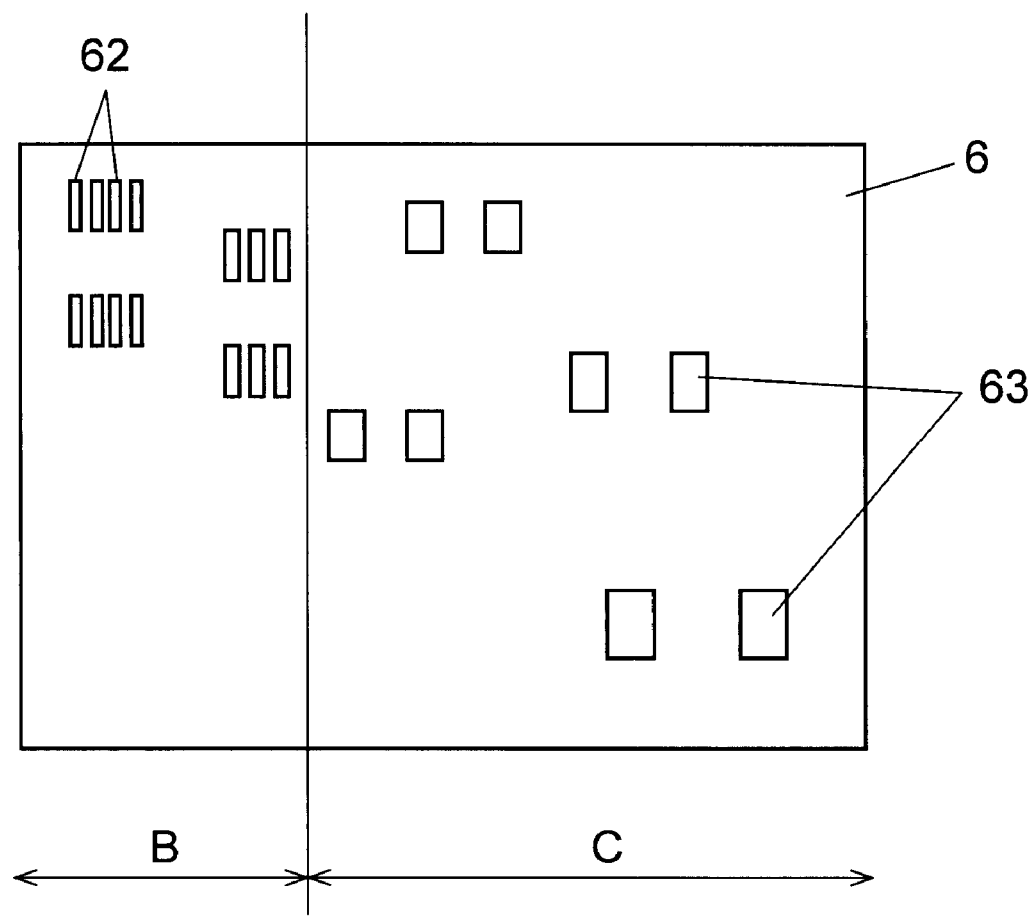
FIG. 9 is a plan view illustrating the substrate to be printed in the screen-printing apparatus shown in FIG. 1.

As shown in FIG. 9, in a case of that narrow-pitch electrodes 62 and normal-pitch electrodes 63 are mixed on substrate 6, when squeegee 131 slides within area B of narrow-pitch electrode 62, two different print-condition parameters—squeegee velocity and print pressure value—are set to be the values different from those in normal range C,. Consequently, this allows the electrodes having different printing properties to be printed at correct squeegee velocity and printing pressure respectively.

Origin-determining section 36—an origin-determining means—identifies a position of each measuring point relative to the origin of the mechanical coordinates of the screen printing apparatus. This identified position is compared with position-detecting signals detected by an encoder mounted in each axis. An origin on the control program for controlling each axis driving each mechanism is determined.

Determining section 36 gives a notice of accuracy failure of mechanism, when data detected on this substrate is out of acceptable limits stored in storing section 32. This notice is displayed on a monitor and by an indicating means for lightening a signal tower and generating an alarm. Determining section 36 and the indicating means such as a monitor act as a failure-indicating means of accuracy failure of the screen printing apparatus.

Then a touch-up print for touching up a failed substrate in printing is demonstrated.

First, another kind of substrates to be printed is prepared and mask 10 for the prepared substrates are placed in the mask plate. Then mask 10 in the mask plate is inspected in a three-dimensional measurement on an upper face of mask 10 by moving laser measuring device 20 over mask 10 by X-axis table 21 and Y-axis table 22. This inspection determines whether or not mask 10 is acceptable.

Next, substrate 6 is inspected. Substrate 6 to be printed is supplied onto positioning-section 1 by conveyor 14. Positioning-section 1 is moved upwardly from the underneath surface of the substrate to the position for measuring the substrate (see positioning-section 1 and substrate 6 indicated by dashed lines in FIG. 2). Then device 20 measures three-dimensionally a top surface of substrate 6. This determines whether substrate 6 is accepted. This inspection may be performed on only new kinds of substrates or on random samples.

Subsequent to determining both mask 10 and substrate 6 to be within acceptable limit, screen printing is carried out by the following procedures:

first, solder paste 9 is supplied onto mask 10;

second, solder paste 9 is kneaded by sliding squeegee 131 reciprocally for preparatory squeezing;

third, substrate 6 is raised by operating Z-axis table 5 of positioning-section 1 and attached to the underneath surface of mask plate 12;

forth, solder paste 9 is printed on electrodes 61 through pattern openings 121; and fifth, substrate 6 is detached from mask plate 12 by lowering Z-axis table; which completes the printing of solder paste 9 on electrodes 61.

Next, printed substrate 6 is inspected through the following procedures. First, positioning-section 1 is upwardly moved from under mask 19 again to the position for measuring the substrate. Second, the top surface of printed substrate 6 is three-dimensionally measured by device 20. When printed substrate 6 is determined to be acceptable, positioning-section 1 is returned to the printed position under the mask and printed substrate 6 is put on conveyor 15, which completes the operation of printing the creamy solder paste.

Then substrate 6 determined to be unacceptable is determined whether or not it can be touched up in this screen-printing apparatus. At this time, if the substrate 6 cannot be touched up in the apparatus, a failure notice is given, then print-failure substrate 6 is conveyed to the outside as acceptable substrates are. Then the print-failure substrate is touched up in another step required. Next, mask 10 is inspected. The state of pattern openings 121 in mask 10, which is used in screen printing of the substrate determined to be failure, are inspected by device 20.

Figure 6:
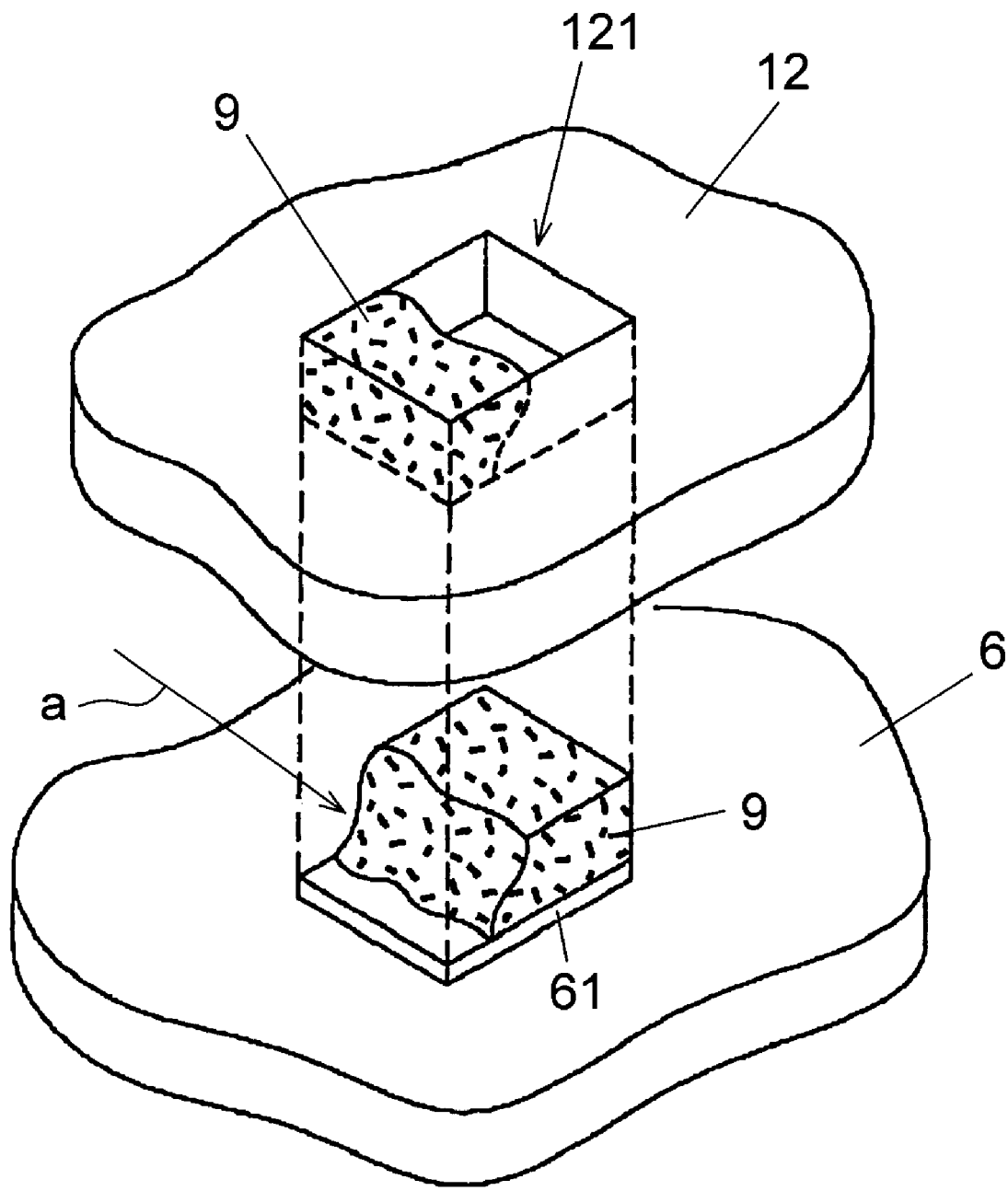
FIG. 6 is a partial perspective view of a substrate and a screen mask in the screen-printing apparatus shown in FIG. 1.

FIG. 6 illustrates an example of information from this inspection. As shown in FIG. 6, a shape of a printed portion on electrode 61 is three-dimensionally determined by a three-dimensional measurement of printed substrate 6. This inspection detects a shape failure, e.g. solder-lacking portion (arrow "a"). Three-dimensional measurement of mask plate 12 detects an inner state of pattern opening 121 corresponding to shape-failure electrode 61. The results of detecting shape of parts printed on electrode 61 are compared with the results of detecting inner state of pattern opening 121, data for identifying causes of this failure are obtained. In other words, when the amount of solder 9 corresponding to solder-lacking portion on electrode 61 is equal to the amount left in pattern opening 121, it is considered that this solder-lacking portion occurs in a process of detaching substrate after creamy solder 9 is filled in pattern opening 121. As opposed to this, when solder 9 is not detected in pattern opening 121 corresponding to electrode 61, it is considered that this solder-lacking occurs by poor filling of solder 9 in pattern opening 121.

Next, when the print-failure substrate is determined to be touched up in the apparatus, the touch-up process is explained hereinafter with reference to FIG. 7. When the print-failure substrate lacks partially solder paste 9, it can be touched up by additionally supplying solder paste 9 into the solder-lack portion by dispenser 24. This touch-up print includes the following steps.

(a) Dispenser 24 is moved to a position to be touched up by driving X-axis table and Y-axis table.

(b) Nozzle 25 is lowered toward the position.

(c) Solder paste 9 is dispensed from nozzle 25 into the position with fine adjustment as necessary.

After solder paste 9 is dispensed, the position is measured again by device 20. When the measurement determines the substrate to be acceptable, substrate 6 is conveyed to outside as normal substrate is. When the measurement determines the substrate to be unacceptable, the substrate is repeatedly touched up.

When touch-up print by additionally supplying solder paste 9 takes too long because many solder-lack-portions are on the substrate, the substrate is printed again through the following procedures:

(a) Positioning-section 1 is horizontally moved to a position to be printed under mask 10.

(b) The substrate is raised by Z-axis table and attached to mask plate 12 again as shown in FIG. 7B.

At this time, parts correctly printed on the substrate 6 are pressed into pattern openings 121 in mask plate 12 again and screen printing is performed by sliding squeegees.

Consequently, the parts correctly printed on the substrate 6 are kept as they are, and solder-paste 9 is filled in pattern openings 121 corresponding to each solder-paste-lack portion. Then substrate 9 is detached from mask plate 12, and solder-paste 9 is added in print-failure portions, which completes the touch-up print.

The post-printing inspection is performed on creamy solder paste printed on the substrate and further on not only the printed substrate but also a screen mask by device 20. This provides a detailed three-dimensional shape of each portion of solder paste printed on substrate 6. Moreover, a state of solder paste 9 left in pattern opening 121 is detected. The printed position on substrate 6 is contrasted with the inside of pattern opening corresponding to the same. Therefore, useful data for identifying the causes of failures are obtained.

When the screen-printing apparatus includes touch-up determining section, and touch-up printing is performed in the apparatus, a touch-up in a separate operation is unnecessary and complicated controls of rejected substrates are simplified. Moreover, selecting properly the way of touch-up print responsive to each print-failure substrate leads to efficient touch-up operation.

Next, setting conditions in screen printing is demonstrated.

First, when one type of substrate is changed to another type of substrate, screen mask 10 responsive to the another type of substrate is placed in the apparatus and mask 10 is inspected. Mask 10 placed in the apparatus is three-dimensionally measured from the above while laser-measuring device 20 is moved over mask 10 by X-axis table 21 and Y-axis table 22. This inspection determines thickness of mask 10 and whether or not mask 10 is acceptable.

Second, substrate 6 is inspected. Substrate 6 to be printed is conveyed onto substrate-positioning-section 1. Positioning-section 1 is moved to the measuring position of the substrate from under mask 10 in the direction of the Y-axis (see positioning-section 1 and substrate 6 indicated by dashed lines). Substrate 6 is three-dimensionally measured by device 20 as mask 10 is. This inspection measures the length and the width of an electrode to be printed formed on substrate 6.

Third, based on the kind of creamy-solder-paste 9 previously input, data of typical dimensions of the electrode on substrate 6 and thickness of mask 10 found by measurement, parameters of print conditions in a library of the print conditions are read. Then a trial printing is performed with the parameters of the printing conditions prior to actual printing.

Next, screen printing is demonstrated.
Screen printing is carried out as follows.
first, solder paste 9 is supplied onto mask 10;
second, solder paste 9 is kneaded by sliding squeegee 131 reciprocally for preparatory squeezing,
third, substrate 6 is raised by operating Z-axis table 5 of positioning-section 1 and attached to the underneath surface of mask plate 12,
forth, solder paste 9 is printed on electrodes 61 through pattern openings 121 by moving squeegee head 13,
fifth, substrate 6 is detached from mask plate 12 by lowering Z-axis table,
finally, trial printing solder paste 9 on electrodes 61 is completed After trial printing, substrate 6 is inspected in printing. (a measuring process after printing). In this inspection, positioning section 1 is moved to the measuring position of the substrate from under mask 10 again. Printed substrate 6 is three-dimensionally measured from the above by device 20. When this inspection determines substrate 6 to be acceptable in printing, the parameters of the printing conditions read at the beginning are determined to be proper. These parameters are set as printing conditions for actual printing of substrate 6, and the conditions are stored in data-storing section 32.

In this measurement after printing, mask 10 can be three-dimensionally measured. This measurement provides data for identifying the causes of print failures and improves the amount and quality of information when a feedback is carried out. The feedback is described below.

When a failure is detected in measurements on the trial printing, a feedback of printing conditions is carried out. This feedback is carried out based on feedback data stored previously in the library of printing condition. In other words, results of the inspection are expressed by numeric data on each predetermined item, e.g. a printed area or a printed height of each electrode. These output data are compared with a reference value predetermined as a proper value, consequently, deviation from reference value is found.

Then parameters of printing conditions, which are in correlation with the deviation, are corrected responsive to the deviation in the direction of plus (+) or minus (−). Trial printing for setting proper printing conditions is carried out many times while changing each printing condition many times. Statical analysis is performed on the results. Data indicating a correlation between the deviation and the amount of correction are prepared by organizing the results of the trial printings systematically repeated, and stored in the library of print conditions in storing section 32.

After the printing conditions are corrected, the trial printing is performed again, and substrate 6 is inspected in printing. When the inspection determines substrate 6 to be acceptable, actual printing is performed. During this printing operation, feedback on printing conditions is performed at a predetermined interval. Namely, substrate 6 is inspected on random samples by device 20 in production process (a post-printing measuring process).

Based on inspecting data collected from the above inspection, a deviation from the reference value in each inspection item is found. Correction of parameters is performed as necessary, and the printing condition for actual printing is changed. This allows printing conditions to be kept within the proper range even when the viscosity of solder paste 9 is changed by ambient temperature. Therefore, high quality of printing can be ensured.

In the screen printing of the embodiment, printed substrate 6 and mask 10 are measured from the above by a three-dimensional measuring means. The screen conditions are set based on the results of measurement. This allows operations of predetermining printing conditions, which requires complicated condition setting operations by skilled labor in prior art, to be simplified, and readily. Therefore, a stable printing quality can be ensured.

Then a mechanism adjusting operation, which is carried out at activation of the screen-printing apparatus, at maintenance or changing one model to another in production line is demonstrated with reference to FIG. 10 and FIG. 11A through FIG. 11C.

Figure 10:
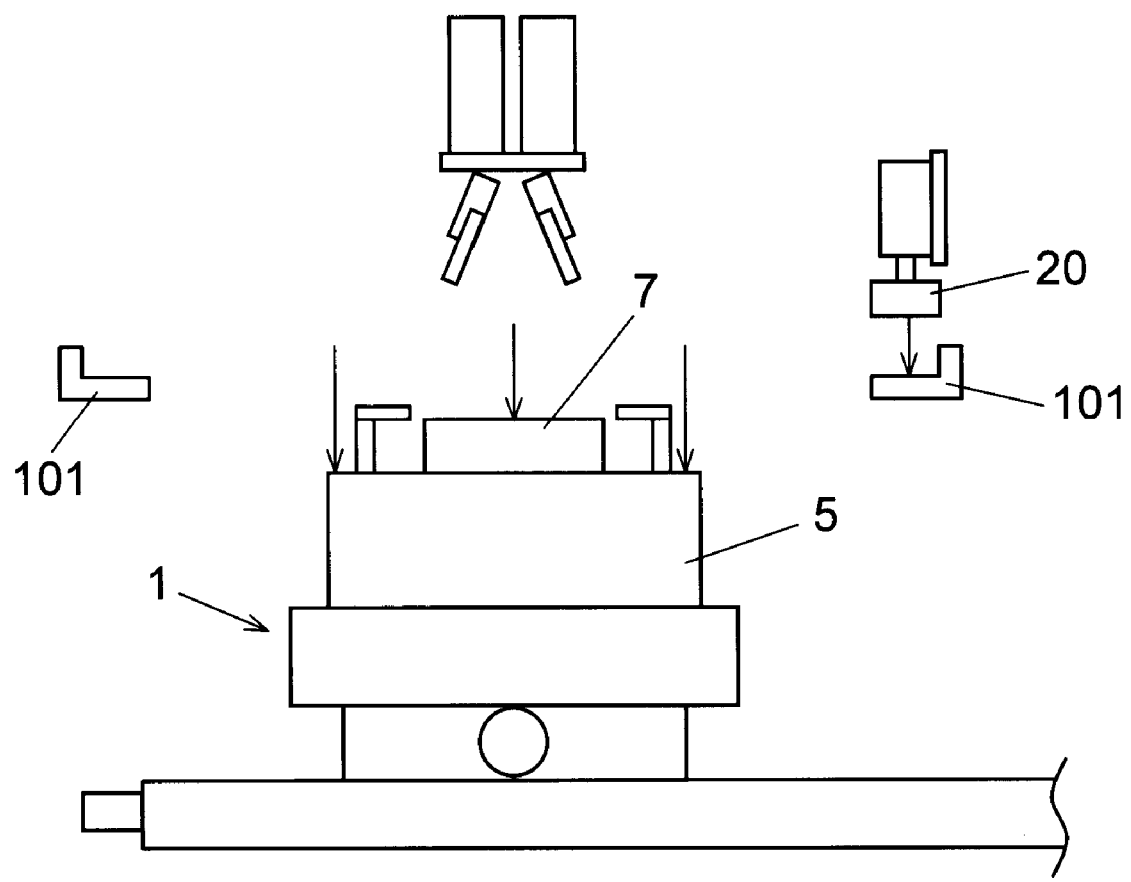
FIG. 10, FIG. 11A, FIG. 11B and FIG. 11C are explanatory views illustrating operations of mechanism adjustment.

First, three-dimensional measurement is performed on each mechanism by device 20 before placing the screen mask in the screen-printing apparatus. As shown in FIG. 10, measuring points (indicated by arrows) are arranged on the followings.

(a) Holding frame 101 placing screen mask
(b) Z-axis table 5 of substrate-positioning mechanism 1
(c) Supporting jig of substrate-holding section7

Device 20 is moved to each measuring point discussed above and measures the respective heights. A height-orientation-displacement-detecting capability of device 20 is particularly useful for this measurement.

A precise height position of the underneath surface of mask plate 12 is determined based on the height position of holding frame 101 of the mask determined by device 20. Therefore, a rising-stopping position of Z-axis table 5, which attaches substrate 6 to the underneath surface of mask plate 12, is precisely set. Height positions of the top surface of Z-axis table 5 and a surface placing a supporting jig on holding section7 are measured. These measuring results are compared with position-detecting signals from an encoder of a Z-axis motor (not shown). This allows an origin of Z-axis table 5 to be precisely set. Consequently, substrate 6 is accurately attached to mask plate 12.

Then, a position of each predetermined measuring point on a plane is measured. Displacements between a coordinate system of positioning section 1 and a coordinate system of X-axis table 21 and Y-axis table 22 used for moving laser-measuring device 20 are found by device 20. In the embodiment, a position of clamper 8 in a horizontal direction is detected, based on the result, the amount of displacement of positioning section 1 is detected. Clamper 8 disposed in positioning section 1 is used to clamp substrate 6 when substrate 6 is placed in the apparatus.

Figure 11A:
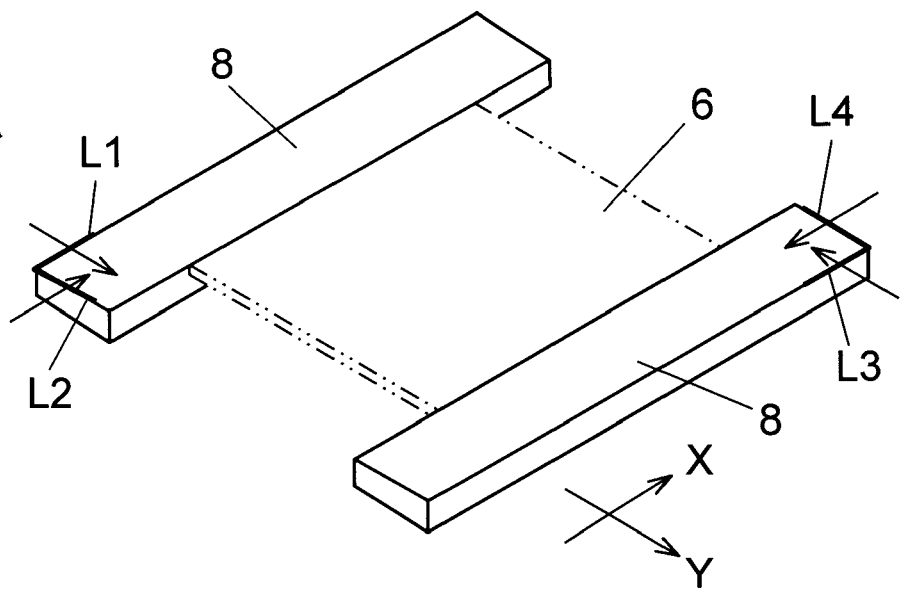
Figure 11B:
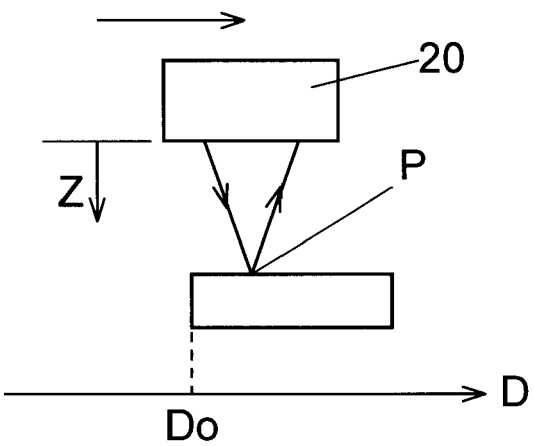
Figure 11C:
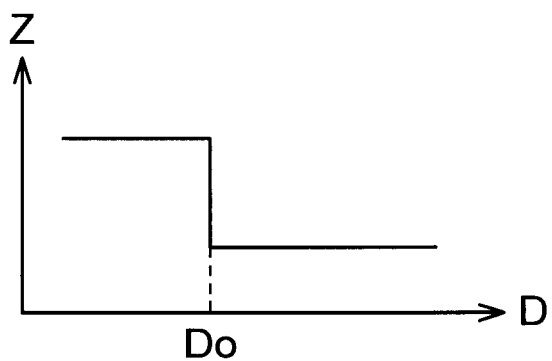

More particularly, as shown in FIG. 11A, first, positions of edge lines L1 and L3 in the X direction, and positions of edge lines L2 and L4 in the Y direction are detected. These edge lines disposed in clamper 8 are parts for measuring. Then, as shown in FIG. 11B, positions of these edge lines are detected by measuring displacement Z in the vertical direction while device 20 scans laser radiation point P in the directions (see FIG. 11A) crossing to each of edge lines L1 through L4. At his time, discontinuous point Do in height of the scanning direction D is detected. The position Do indicates a position where the edge line is detected.

Detection of four edges lines L1, L2, L3, L4 arranged in clamper 8 allows two positions in the horizontal plane to be located. As a result, the amount of displacement from the X-direction, the Y-direction respectively, and the amount of displacement from the θ direction in rotation are detected. In other words, the amount of displacement in the direction of axes orthogonal to each other and the amount of displacement in rotation in the plane are detected. Consequently, the amount of correction in position is obtained to determine relative positions in mutually independent orthogonal coordinates.

Moreover, the amount of correction in position is calculated based on the amount of displacement in position and an angle of displacement. Then machine parameters in the program controlling operations of positioning section 1 are modified. This allows relative positions in operation among positioning section 1 and X-axis table and Y-axis table to be properly kept consistently. Moreover, errors causing in detecting a position of substrate 6 can be reduced.

In the above embodiment, however, displacement of position can be detected by holding a sample substrate with clamper 8 and determining positions of typical portion of the substrate (e.g. openings and edges), instead of by determining positions of four edge lines L1 through L4 of clamper 8.

After adjusting machines is performed on the screen-printing apparatus, the screen-printing operation described is carried out.

In this printing operation, position accuracy of the mechanisms is checked at a predetermined interval. In other words, height positions of the surface of screen mask 10 and the supporting jig of substrate-holding section 7 are measured on random samples by device 20. If displacement from initially predetermined conditions is detected, correction of origin position is carried out. Consequently, when mechanical accuracy changes slightly by external factors, e.g. changes of ambient conditions, operation accuracy at printing is properly kept all the time, and high-quality of printing can be ensured.

However, a hermetically sealed squeegee head can be used, instead of an open-system squeegee head having plate squeegees 131 used in the above embodiment. This hermetically sealed squeegee head can fill creamy solder paste in pattern openings by sliding a squeegee on a mask plate by applying pressure to the creamy solder paste stored in the head.

According to the present invention, the screen printing apparatus comprises the following element:

(a) Three-dimensional means for measuring three-dimensionally the top surface of the screen mask and the top surface of the substrate at the measuring position of the substrate;

(b) Moving means for moving this three-dimension measuring means; and (c) Inspecting means for inspecting substrate and/or screen mask.

As a result, before and after screen printing is carried out, both the substrate and the screen mask can be inspected, therefore, when failures occur, causes of the failure can be readily identified. When touch-up means is prepared, printing failure can be touched up in the apparatus. Therefore, a separate operation for touch-up is unnecessary.

Furthermore, the substrate and the screen mask are measured from the above by three-dimensional-measuring means after printing is completed, screen-printing conditions are set based on the measurement. Consequently, setting operations of print condition can be simplified, dispersions in setting of printing condition can be removed, and further stable printing quality can be ensured.

Additionally, a predetermined measuring position of the mechanisms in the screen-printing apparatus is measured by three-dimensional measuring means. Then the predetermined measuring position on the object to be measured is determined on a position relative to the origin of the mechanical coordinate system in the screen-printing apparatus. As a result, machine adjusting operation and teaching operation in the screen-printing apparatus can be simplified with high accuracy.

What is claimed is:

1. A screen-printing apparatus for printing paste on a substrate through pattern openings of a screen mask by attaching the screen mask to the substrate and sliding a squeegee head on the screen mask, comprising:
   (a) a substrate-positioning means for positioning the substrate relative to the screen mask having the pattern openings;
   (b) a three-dimensional-measuring means for measuring three-dimensionally a top surface of the screen mask at a printing position and a top surface of the substrate at a measuring position of the substrate;
   (c) a moving means for moving said three-dimensional-measuring means;
   (d) an inspecting means for inspecting at least one of the substrate and the screen mask based on a result of measurement by said three-dimensional-measuring means,
      wherein the inspecting means includes a supply-material-determining section for determining pass or fail of at least one of the screen mask and the substrate,
      wherein the inspecting means includes a print-determining section for determining pass or fail of the printing result of the substrate; and
   (e) a touch-up means for touching up a print-failure part of the substrate determined to be print failure by said print-determining section.

2. The screen-printing apparatus according to claim 1 wherein said touch-up means includes a touch-up-determining section for determining whether or not reprinting is necessary to the substrate determined as a failure.

3. The screen-printing apparatus according to claim 1, wherein said touch-up means includes a paste-dispensing means for adding paste to the print-failure part by dispensing the paste.

4. A method of screen printing paste on a substrate trough pattern openings of a screen mask by attaching the screen mask having the pattern openings to the substrate and sliding a squeegee bead on the screen mask, said method comprising the steps of:
   (a) positioning the substrate relative to the screen mask;
   (b) measuring three-dimensionally a top surface of the screen mask at a printing position and a top surface of the substrate at a measuring position of the substrate by a three-dimensional measuring means moved by a moving means;
   (c) inspecting at least one of the substrate and the screen mask based on a measuring result by said three-dimensional measuring means, wherein the inspecting step includes determining whether the printing result of the substrate passes or fails; and
   (d) touching up a print-failure part of the substrate determined to be print failure.

5. A method of screen printing paste on a substrate through pattern openings of a screen m ask by attaching the screen mask having the pattern openings to the substrate and sliding a squeegee head on the screen mask, said method comprising the steps of:
   (a) measuring from above at least one of the screen mask after being printed at a printing position and the substrate after being printed at a measuring position of the substrate by a three-dimensional-measuring means;
   (b) setting printing conditions of screen printing based on a result measured by said three-dimensional-measuring means; and
   (c) storing the printing conditions set in a print-condition-storing means,
      wherein the printing conditions include:
         a squeegee velocity at which the squeegee slides;
         a print-pressure value at which the squeegee is urged against the screen mask;
         a substrate-detaching velocity indicating a detaching velocity of the substrate relative to the screen mask and a substrate-detaching-distance indicating a detaching distance or the substrate relative to the screen mask.

6. The method of screen printing according to claim 5, wherein step (a) is performed before printing starts and after trial printing is completed and printing conditions for actual printing are determined based on results set in step (b).

7. The method of screen printing according to claim 5, wherein step (a) is performed at a predetermining timing during actual printing, and printing conditions for the actual printing are changed based on results set in step (b).

8. A screen-printing apparatus for printing paste on a substrate through pattern openings of a screen mask by attaching the screen mask to the substrate and sliding a squeegee head on the screen mask, comprising:
   a substrate-positioning means for positioning the substrate relative to the screen mask having the pattern openings;
   a three-dimensional-measuring means for measuring three-dimensionally a top surface of the screen mask at a printing position and a top surface of the substrate at a measuring position of the substrate;
   a moving means for moving said three-dimensional-measuring means;
   an inspecting means for determining pass or fail of the printing result of the substrate; and
   a touch-up means for touching up a print-failure part of the substrate determined to be print failure by said inspecting means.

* * * * *